United States Patent [19]

Harwylo

[11] 4,158,849
[45] Jun. 19, 1979

[54] HETEROJUNCTION SEMICONDUCTOR DEVICE

[75] Inventor: Frank Z. Harwylo, Trenton, N.J.

[73] Assignee: RCA Corporation, New York, N.Y.

[21] Appl. No.: 890,705

[22] Filed: Mar. 27, 1978

[51] Int. Cl.² .......................................... H01L 29/161
[52] U.S. Cl. ......................................... 357/16; 357/30; 357/17; 357/18
[58] Field of Search .................... 357/16, 17, 30, 18

[56] References Cited

U.S. PATENT DOCUMENTS

| | | | |
|---|---|---|---|
| 3,369,132 | 2/1968 | Fang | 307/299 |
| 3,603,847 | 9/1971 | Shepherd | 317/234 R |
| 3,982,261 | 9/1976 | Antypas | 357/16 |
| 4,074,305 | 2/1978 | Johnston | 357/67 |
| 4,081,290 | 3/1978 | Bachmann | 136/89 TF |

Primary Examiner—Martin H. Edlow
Attorney, Agent, or Firm—H. Christoffersen; D. S. Cohen

[57] ABSTRACT

A layer of germanium on a body of P type conductivity single crystal indium phosphide provides a blocking heterojunction. This device will emit light when a suitable voltage is placed thereacross or the device can be used as a photoconductor to generate electrons when light is directed thereon.

4 Claims, 1 Drawing Figure

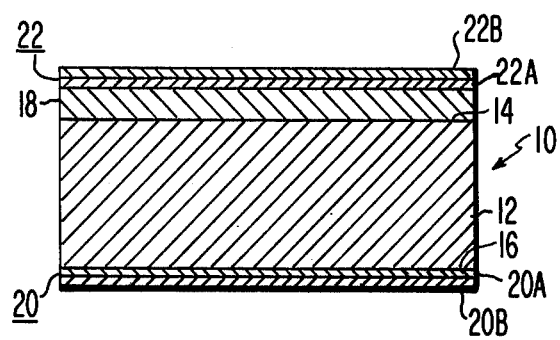

HETEROJUNCTION SEMICONDUCTOR DEVICE

The invention described herein was made in the performance of work under a NASA contract and is subject to the provisions of section 305 of the National Aeronautics and Space Act of 1958, Public Law 85-568 (72 Stat. 435; 42 U.S.C. 2457).

The present invention relates to a heterojunction semiconductor device and particularly to such a device which can be used as either an electroluminescent device to emit light or a photoconductor.

Compound semiconductor materials of the Group III and Group V elements of the periodic chart are used for many semiconductor devices because of the relatively high bandgap energy of these materials. Also, various bandgap energies can be achieved by using different combinations of the Group III-V elements and alloys of the compounds. Such semiconductor devices as light emitting diodes, laser diodes, photoconductors, and high frequency field effect transistors may be made from the Group III-V compound semiconductor materials and alloys of the compounds. For some of the semiconductor devices it is desirable to have a blocking heterojunction in the body of the device. Such heterojunctions are generally formed by epitaxially growing on the surface of a substrate a first layer of a semiconductor material of one conductivity type and then on the first layer a second layer of a semiconductor material of the opposite conductivity type and of a composition that provides such a heterojunction. The semiconductor layers may be epitaxially grown by either of the well known techniques of vapor phase epitaxy and liquid phase epitaxy. The present invention relates to a novel blocking heterojunction, particularly with a body of indium phosphide.

The FIGURE of the drawing is a sectional view of one form of a semiconductor device having the blocking heterojunction of the present invention.

Referring to the drawing, one form of semiconductor device embodying the present invention, is generally designated as 10. The semiconductor device 10 comprises a body 12 of P type conductivity single crystalline indium phosphide having a pair of opposed surfaces 14 and 16. On the surface 14 of the indium phosphide body 12 is a layer 18 of germanium. The germanium layer 18 may be applied to the surface 14 of the indium phosphide body 12 by either of the well known techniques of vacuum evaporation or sputtering. On the surface 16 of the indium phosphide body 12 is a conductive contact 2 of a material which makes good ohmic contact with the P type indium phosphide. As shown, the contact 20 includes two layers 20A and 20B. The layer 20A, which is directly on the surface 16, may be of electrolessly plated nickel which adheres well and makes ohmic contact to indium phosphide. The outer layer 20B may be of gold which is plated on the nickel layer 20A. On the germanium layer 18 is a conductive contact 22 which makes ohmic contact with the germanium layer. As shown, the contact 22 also comprises two layers 22A and 22B which may be of the same materials as the layers 20A and 20B respectively, of the contact 20.

I have found that the germanium layer 18 forms a blocking heterojunction with the P type indium phosphide body 12. I have found that when a voltage is placed across the device 10 the I-V (current voltage) characeristics are that of a blocking junction, i.e., there is current rectification in the reverse polarity direction and current flows in the forward direction. It is known that germanium is a donor in indium phosphide. Although when the germanium is deposited on the indium phosphide body the indium phosphide body is at a temperature below which germanium would normally alloy with the indium phosphide, I believe that some kind of eutectic is formed at the interface between the germanium and the indium phosphide which permits the alloying of the germanium and the indium phosphide at the lower temperature. This would form a thin N type conductivity region along the surface 14 which forms a blocking junction with the P type conductivity indium phosphide body 12. I have also found that if the device is heated for a short period of time, such as at 400° C. for three minutes in hydrogen, the I-V characteristics of the device are improved.

EXAMPLE

A light emitting diode was made by placing a body of P type conductivity indium phosphide in a vacuum chamber beneath a tungsten filament on which was germanium. The indium phosphide body was mounted with a surface being about three inches (7.6 centimeters) away from the filament. The chamber was hermetically sealed and pumped down to a pressure of about $10^{-6}$ mm of mercury. The tungsten filament was then heated to a temperature at which the germanium then evaporated, about 1000° C. to 1100° C. The germanium vapors condensed on the surface of the indium phosphide body to form a layer of germanium thereon. A germanium layer 2000 to 3000 Angstroms (200–300 nanometers) thick was deposited on the indium phosphide body. After removing the indium phosphide body from the chamber, a layer of nickel was simultaneously electrolessly plated on the opposite surfaces of the indium phosphide body and the germanium layer. A layer of gold was then electrolessly plated on the layers of nickel. When a voltage of about 1 to 2 volts was applied across the device so as to forward bias the heterojunction between the germanium layer and the indium phosphide body, light was emitted from the device. The light was of a wavelength of about 9700Å (970 nanometers).

A photodetector can be made from the semiconductor device 10 by making the germanium layer 18 thin enough so that optical radiation can pass through the germanium layer into the indium phosphide body 12. The contact 22 is coated on only a portion of the germanium layer 18 such as a ring along the periphery of the germanium layer.

I claim:

1. A heterojunction semiconductor device comprising a body of indium phosphide and a layer of germanium on a surface of the indium phosphide body and forming a blocking junction therebetween.

2. A heterojunction semiconductor device in accordance with claim 1 in which the indium phosphide body is of a P-type conductivity.

3. A heterojunction semiconductor device in accordance with claim 2 in which the indium phosphide body has opposed surfaces, the germanium layer is on one of the opposed surfaces, a conductive contact is on the other of said opposed surfaces and a conductive contact is on the germanium layer.

4. A heterojunction semiconductor device in accordance with claim 3 in which each of said conductive contacts includes a layer of nickel on the germanium layer and on the indium phosphide body respectively, and a layer of gold on the nickel layer.

* * * * *